(12) United States Patent
Yang et al.

(10) Patent No.: US 11,258,091 B2
(45) Date of Patent: Feb. 22, 2022

(54) BATTERY AND METHOD FOR PREPARING THE SAME

(71) Applicant: CONTEMPORARY AMPEREX TECHNOLOGY CO., LIMITED, Ningde (CN)

(72) Inventors: Limei Yang, Ningde (CN); Xiaomei Liu, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 278 days.

(21) Appl. No.: 16/420,773

(22) Filed: May 23, 2019

(65) Prior Publication Data

US 2019/0363391 A1 Nov. 28, 2019

(30) Foreign Application Priority Data

May 24, 2018 (CN) .......................... 201810510810.X

(51) Int. Cl.
*H01M 10/04* (2006.01)
*H01M 10/48* (2006.01)
(Continued)

(52) U.S. Cl.
CPC ...... *H01M 10/0418* (2013.01); *G01R 31/392* (2019.01); *H01M 4/8828* (2013.01); *H01M 10/0459* (2013.01); *H01M 10/48* (2013.01)

(58) Field of Classification Search
CPC ......... H01M 4/0435; H01M 2004/025; H01M 10/0418
See application file for complete search history.

(56) References Cited

U.S. PATENT DOCUMENTS

2008/0248386 A1   10/2008  Obrovac et al.
2009/0297940 A1   12/2009  Nansaka et al.
(Continued)

FOREIGN PATENT DOCUMENTS

CN   101436656 A   5/2009
CN   103311554 A   9/2013
(Continued)

OTHER PUBLICATIONS

Extended European Search Report for European Patent Application No. 19176515.5 dated Oct. 23, 2019.
(Continued)

*Primary Examiner* — Stephan J Essex
(74) *Attorney, Agent, or Firm* — Heslin Rothenberg Farley and Mesiti PC; Nicholas Mesiti

(57) ABSTRACT

The present disclosure provides a battery and method for preparing the same. The battery includes a cell and an electrolyte; the cell includes a positive electrode plate, a negative electrode plate and a separator. Wherein in the battery, at least one surface of the positive electrode film and/or the negative electrode film is provided with protrusions, with a proviso that: $0.3 \leq (T_c+T_a)/(H_c+H_a) \leq 1$; wherein $T_c$ is a height of the protrusions provided on the at least one surface of the positive electrode film, $T_a$ is a height of the protrusions provided on the at least one surface of the negative electrode film, $H_c$ is a thickness increase of the positive electrode film when the battery has a 100% SOC, $H_a$ is a thickness increase of the negative electrode film when the battery has a 100% SOC.

11 Claims, 5 Drawing Sheets

(51) Int. Cl.
    *H01M 4/88*     (2006.01)
    *G01R 31/392*   (2019.01)

(56) References Cited

U.S. PATENT DOCUMENTS

2014/0023898 A1 * 1/2014 Minami ................ H01M 50/46
                                                    429/94
2019/0013523 A1 * 1/2019 Shibuya ................ H01M 4/13

FOREIGN PATENT DOCUMENTS

| EP | 2056381 A1 | 5/2009 | |
|----|---|---|---|
| JP | 2005108521 A | 4/2005 | |
| JP | 2009266718 A | 11/2009 | |
| WO | 03088403 A1 | 10/2003 | |
| WO | WO-2017130910 A1 * | 8/2017 | ............. C08F 20/56 |

OTHER PUBLICATIONS

Search Report for Chinese Patent Application No. 201810510810.X dated Jul. 27, 2020.

* cited by examiner

BATTERY AND METHOD FOR PREPARING THE SAME

CROSS-REFERENCE TO RELATED APPLICATION

The present disclosure claims the priority benefit of Chinese Patent Application Serial No. 201810510810.X filed on May 24, 2018 and entitled "BATTERY AND METHOD FOR PREPARING THE SAME", the disclosure of which is incorporated herein by reference in its entirety.

TECHNICAL FIELD

The present disclosure relates to the technical field of batteries, and particularly to a battery and method for preparing the same.

BACKGROUND

As a core area in the development of new energy vehicle industry, power batteries have always been a focus of extensive attention. However, with the continuous application and promotion of new energy vehicles, increasingly higher requirement is raised for the energy density of power batteries. In order to improve the energy density of the power battery, a currently widely adopted method is to increase the compacted density of the positive and negative electrodes, and increase the coating weight per unit area of the current collector, to achieve the compression of a cell in the internal space. However, in practical applications, due to the change in physical force of the cell material itself or due to the accumulation of side reaction products inside the cell, the expansive force of the cell is constantly increased. For example, when the capacity is attenuated to 80% under a cyclic condition of 60° C., the expansive force of the cell increases sharply to 35000 N, which brings a safety hazard to the structure of the power battery module. Especially when the expansive force of the cell exceeds the endurance of the end plate of the power battery module, the overall structure of the power battery module is destroyed, and the hierarchical structure of the power battery module is unstable, which may cause a serious decline in the safety performance of the new energy vehicles.

SUMMARY

In one embodiment of the present disclosure, it is provided a battery and a method for preparing the same, which can effectively reduce the expansive force of the battery throughout the entire life cycle, so that the battery has both high safety and long cycle life.

In a first aspect, the present disclosure provides a battery including a cell and an electrolyte, the cell includes a positive electrode plate, a negative electrode plate and a separator. Where the positive electrode plate includes a positive electrode current collector, and a positive electrode film disposed on at least one surface of the positive electrode current collector and including a positive electrode active material. Where the negative electrode plate includes a negative electrode current collector and a negative electrode film disposed on at least one surface of the negative electrode current collector and including a negative electrode active material. Where the separator is disposed between the positive electrode plate and the negative electrode plate. And in the battery, at least one surface of the positive electrode film and/or the negative electrode film is provided with protrusions, and with a proviso that $0.3 \leq (T_c + T_a)/(H_c + H_a) \leq 1$; where $T_c$ is a height of the protrusions provided on the at least one surface of the positive electrode film, $T_a$ is a height of the protrusions provided on the at least one surface of the negative electrode film, $H_c$ is a thickness increase of the positive electrode film when the battery has a 100% state of charge (SOC), and $H_a$ is a thickness increase of the negative electrode film when the battery has a 100% state of charge (SOC).

In a second aspect, the present disclosure provides a method for preparing a battery, in particular for preparing the battery according to the first aspect of the present disclosure, the method includes the steps of:

step 1: coating a positive electrode slurry including a positive electrode active material onto a positive electrode current collector, drying and cold pressing, to obtain a positive electrode plate; coating a negative electrode slurry including a negative electrode active material onto a negative electrode current collector, drying and cold pressing, to obtain a negative electrode plate; and measuring an initial thickness of a positive electrode film in the positive electrode plate as $H_1$, an initial thickness of a negative electrode film in the negative electrode plate as $H_2$;

step 2: assembling the positive electrode plate and the negative electrode plate prepared in step 1, a separator, and an electrolyte into a case to obtain a battery to be tested, charging the battery to be tested to 100% SOC, and disassembling the battery to be tested after being disconnected from a power supply; measuring a thickness of the positive electrode film as $H_1'$, a thickness of the negative electrode film as $H_2'$, and calculating a thickness increase of the positive electrode film as $H_c = H_1' - H_1$, and a thickness increase of the negative electrode film as $H_a = H_2' - H_2$; and step 3: roll compacting the positive electrode plate and/or the negative electrode plate prepared in step 1 using a counter roller having a protrusion structure to form protrusions on at least one surface of the positive electrode film and/or the negative electrode film, and with a proviso that $0.3 \leq (T_c + T_a)/(H_c + H_a) \leq 1$, where $T_c$ is a height of the protrusions provided on the at least one surface of the positive electrode film, $T_a$ is a height of the protrusions provided on the at least one surface of the negative electrode film; and then reassembling the obtained positive electrode plate and the negative electrode plate, the separator, and the electrolyte into a case, to obtain a battery.

Compared with the existing technology, the present disclosure has at least including the following advantages:

The present disclosure solves the problem of battery expansion from the perspective of cell design. And on at least one surface of the positive electrode film and/or the negative electrode film is provided with protrusions, a height of the protrusions is designed according to a thickness increase of the corresponding electrode film, thereby reserving a space in advance for the volume expansion during the charging and discharging cycle of the positive and negative electrode plates, decreasing the expansive force of the battery throughout the life cycle, reducing pressure withstood by the module due to battery expansion, and further reducing the safety hazard of the power battery module structure.

The battery of the present disclosure has both high safety and long cycle life.

The battery of the present disclosure has a simple structure, thereby can reduce production costs and improve production efficiency.

Figure 1:
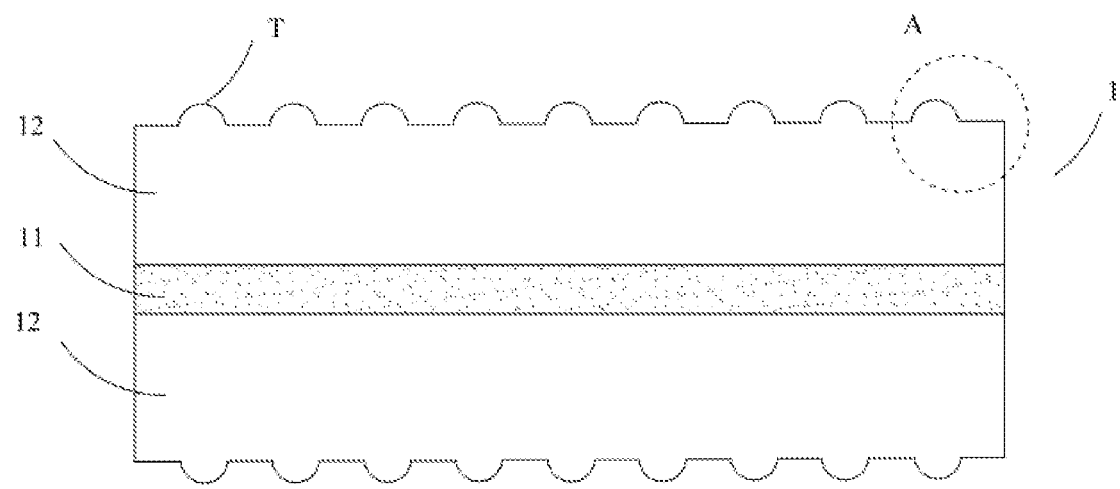
FIG. 1 is a structural schematic view of an embodiment of a positive electrode plate according to the present disclosure.
Figure 2:
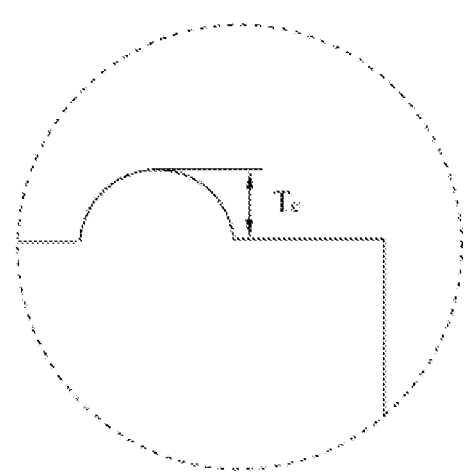
FIG. 2 is an enlarged view at partial A of FIG. 1.
Figure 3:
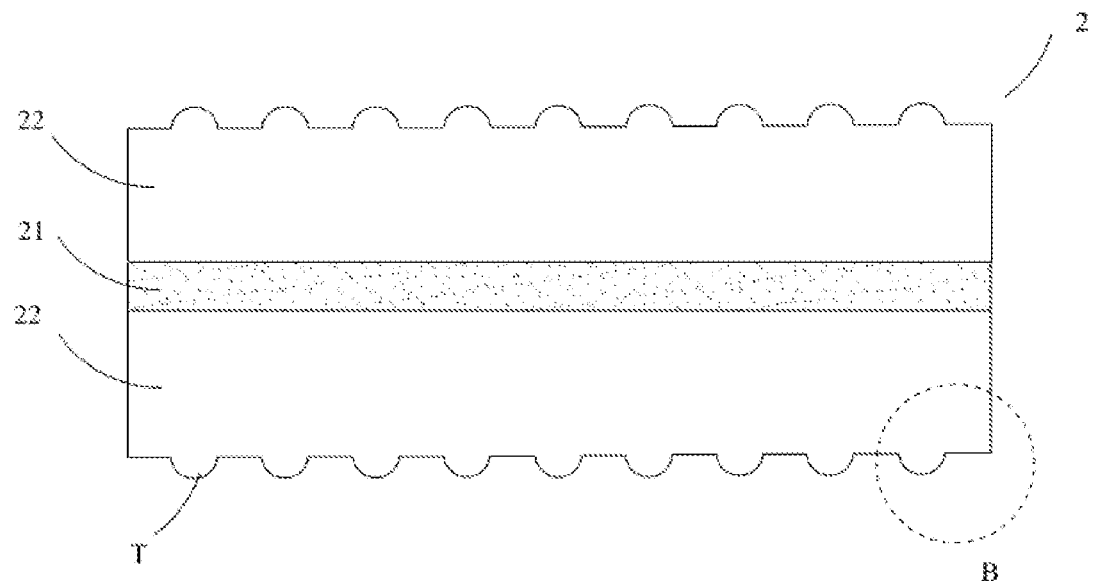
FIG. 3 is a structural schematic view of an embodiment of a negative electrode plate according to the present disclosure.
Figure 4:
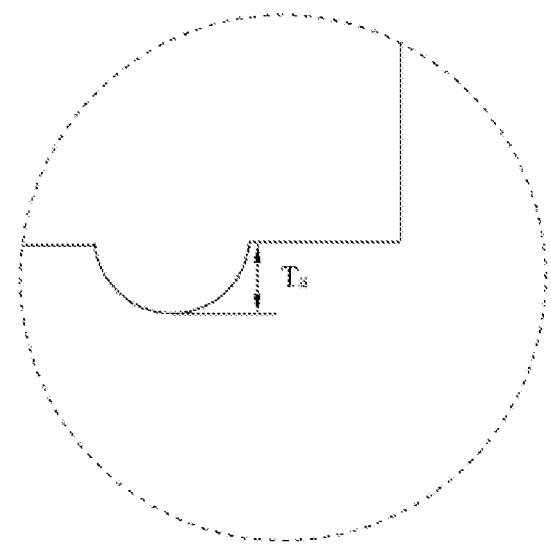
FIG. 4 is an enlarged view at partial B of FIG. 3.

WHERE REFERENCE NUMERALS ARE REPRESENTED AS FOLLOWS 1. positive electrode plate
11. positive electrode current collector
12. positive electrode film
2. negative electrode plate
21. negative electrode current collector
22. negative electrode film
3. separator
T. protrusion

DETAILED DESCRIPTION

In order to solve the problem of the expansive force of the cell, the hierarchy of the power battery module generally adopts a solution in which an expansion space is reserved when the cell is assembled or a patch material capable of absorbing the expansive force is added between adjacent cells. However, it is difficult to increase the reserved expansion space when assembling the cells and the consistency of the gap between the cells is difficult to be ensured. Although the addition of patch material capable of absorbing the expansive force between adjacent cells solves the problem to a certain extent, the cost is generally increased obviously. According to embodiments of the present disclosure, it is provided a battery and a method of fabricating the same to solve the above problems.

The battery and method for preparing the same according to the present disclosure are described in detail below.

Firstly, the battery according to the first aspect of the present disclosure is described. In an embodiment of the present disclosure, the battery includes a cell and an electrolyte. Referring to FIG. 1 to FIG. 7, where the cell includes a positive electrode plate 1, including a positive electrode current collector 11 and a positive electrode films 12 disposed on surfaces of the positive electrode current collector 11 and including a positive electrode active material;

a negative electrode plate 2, including a negative electrode current collector 21 and a negative electrode films 22 disposed on surfaces of the negative electrode current collector 21 and including a negative electrode active material; and a separator 3, disposed between the positive electrode plate 1 and the negative electrode plate 2.

In the battery, the surfaces of the positive electrode film 12 and/or the negative electrode film 22 is provided with protrusions T, and the protrusions T provided on surfaces of the positive electrode film 12 have a height $T_c$, the protrusions T provided on surfaces of the negative electrode film 22 have a height $T_a$, and the thickness increase of the positive electrode film 12 is $H_c$ when the battery has a 100% state of charge (SOC) (that is, when the battery is fully charged for the first time), the thickness increase of the negative electrode film 22 is $H_a$ when the battery has a 100% state of charge (SOC) (that is, when the battery is fully charged for the first time), and the battery satisfies the condition that: $0.3 \leq (T_c+T_a)/(H_c+H_a) \leq 1$.

The present disclosure solves the problem of battery expansion from the perspective of cell design. And on the surfaces of the positive electrode film and/or the negative electrode film is provided with protrusions, a height of the protrusions is designed according to a thickness increase of the corresponding electrode film, thereby reserving a space in advance for the volume expansion during the charging and discharging cycle of the positive and negative electrode plates, decreasing the expansive force of the battery throughout the life cycle, reducing pressure withstood by the module due to battery expansion, and further reducing the safety hazard of the power battery module structure.

In the cell design of the present disclosure, protrusions having appropriate height are provided on the surface of the positive electrode film and/or the negative electrode film, such that the battery can have both high safety and long cycle life. If the protrusions are not high enough to provide sufficient space during charging and discharging of the battery to accommodate the volume expansion of the positive and negative electrode plates, due to the expansive force of battery is still high, with a result that the cycle performance and safety performance of the battery will be poor. If the protrusions are too high, although they can provide sufficient space to accommodate the volume expansion of the positive and negative electrode plates during charging and discharging of the battery, a too large volume expansion space may causes the electrolyte to be relatively insufficient, so that the electrolyte infiltration of the positive and negative electrode plates becomes poor, the polarization of the battery is increased during charging, and the transport path of the ions is too long during charging and discharging, which seriously affect the cycle life of the battery. In an example, $0.4 \leq (T_c+T_a)/(H_c+H_a) \leq 0.8$; and in another example, $0.6 \leq (T_c+T_a)/(H_c+H_a) \leq 0.8$.

In an embodiment of the battery according to the first aspect of the present disclosure, the specific values of the height $T_c$ of the protrusions T provided on the surfaces of the positive electrode film 12 and the height $T_a$ of the protrusions T provided on the surfaces of the negative electrode film 22 are not particularly limited, as long as the ratio of the sum of the two to $(H_c+H_a)$ is between 0.3 to 1. In an embodiment of the present disclosure, the ratio of the sum of $(T_c+T_a)$ to the sum of $(H_c+H_a)$ is 0.3, 0.4, 0.5, 0.6, 0.7, 0.8, 0.9 or 1, including any and all ranges and subranges (for example 0.4-0.8 or 0.6~-0.8).

Figure 5:
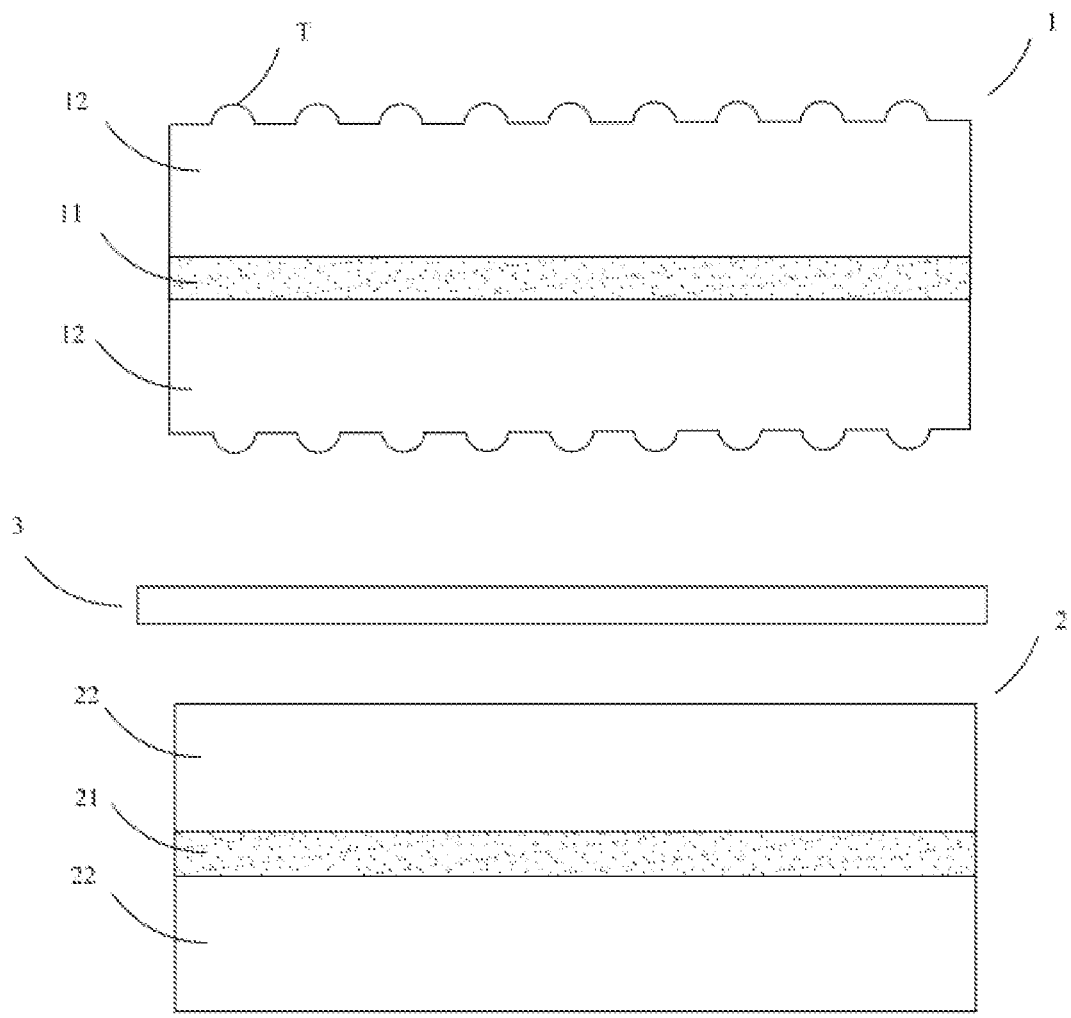
FIG. 5 is a structural schematic view of an embodiment of a cell before assembling according to the present disclosure.

In a specific embodiment of the present disclosure, referring to FIG. 5, protrusions T may be provided only on the surfaces of the positive electrode film 12. In this case, the height $T_a$ of the protrusions T on the surfaces of the negative electrode film 22 is zero. As such, the battery satisfies the condition that: $0.3 \leq (T_c+T_a)/(H_c+H_a) \leq 1$, in an example, $0.4 \leq (T_c+T_a)/(H_c+H_a) \leq 0.8$, and in another example, $0.6 \leq (T_c+T_a)/(H_c+H_a) \leq 0.8$.

Figure 6:
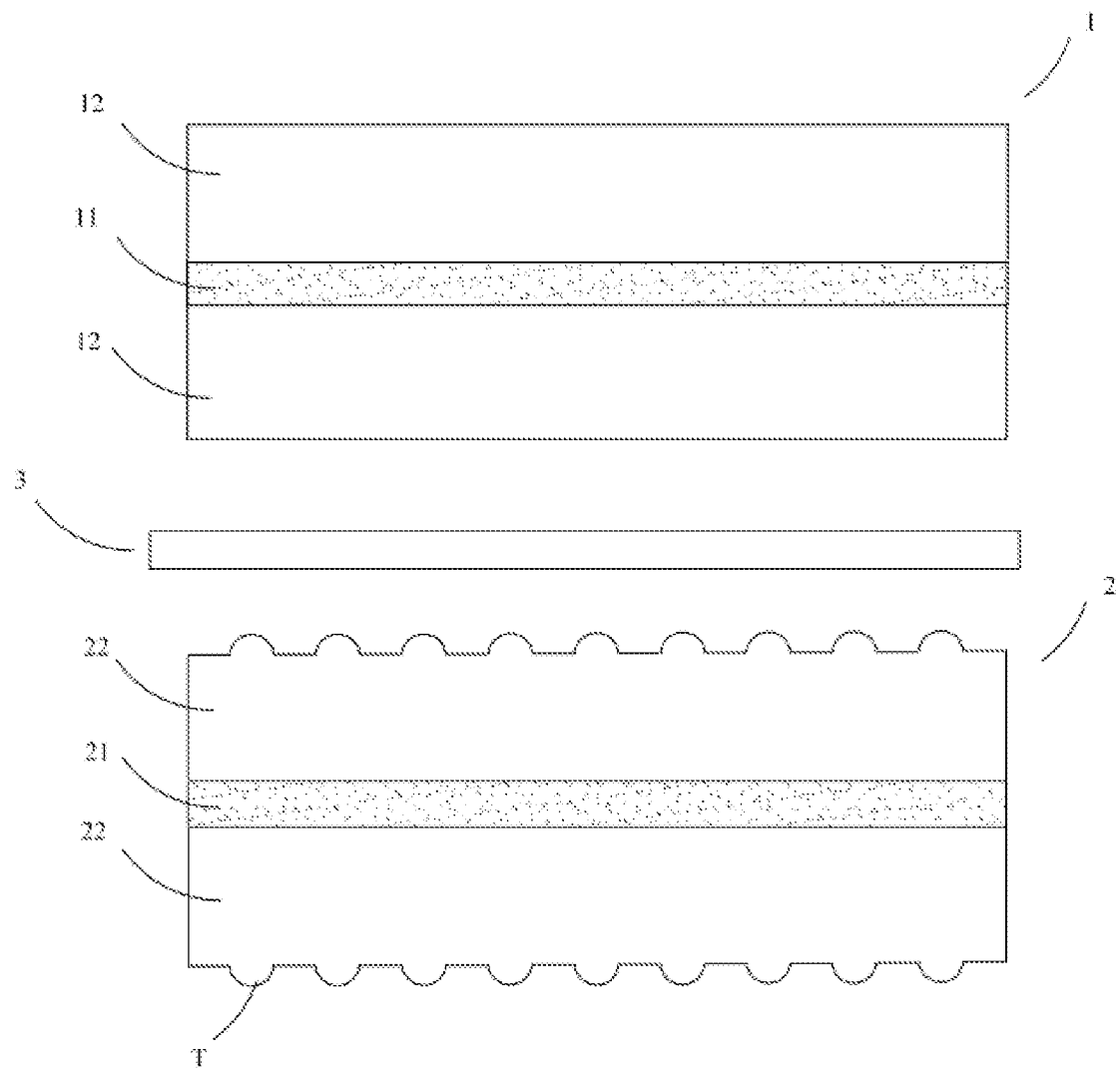
FIG. 6 is a structural schematic view of another embodiment of a cell before assembling according to the present disclosure.

In another specific embodiment of the present disclosure, referring to FIG. 6, protrusions T may be provided only on the surfaces of the negative electrode film 22. In this case, the height $T_c$ of the protrusions T on the surfaces of the positive electrode film 12 is zero. As such, the battery satisfies the condition that: $0.3 \leq (T_c+T_a)/(H_c+H_a) \leq 1$ in an example, $0.4 \leq (T_c+T_a)/(H_c+H_a) \leq 0.8$ and in another example, $0.6 \leq (T_c+T_a)/(H_c+H_a) \leq 0.8$.

Figure 7:
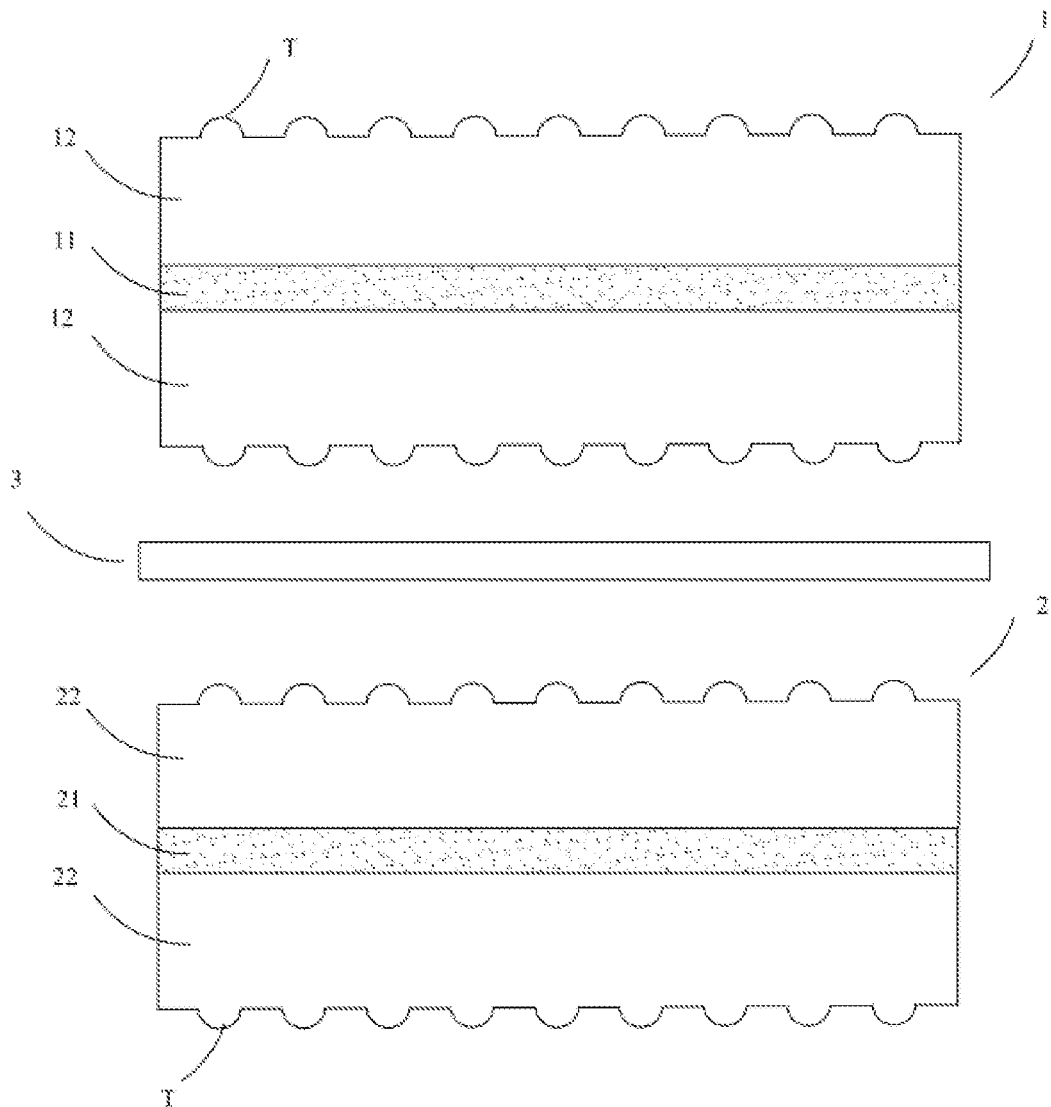
FIG. 7 is a structural schematic view of another embodiment of a cell before assembling according to the present disclosure.

In a further specific embodiment of the present disclosure, referring to FIG. 7, protrusions T are provided on the surfaces of both the positive electrode film 12 and the negative electrode film 22, and $T_a$ and $T_c$ are both greater than zero. As such, the battery satisfies the condition that: $0.3 \leq (T_c+T_a)/(H_c+H_a) \leq 1$, in an example, $0.4 \leq (T_c+T_a)/(H_c+H_a) \leq 0.8$, and in another example, $0.6 \leq (T_c+T_a)/(H_c+H_a) \leq 0.8$.

In an embodiment of the present disclosure, the protrusions T are only provided on the surfaces of the positive electrode film 12. This is because the cohesiveness of the negative electrode plate is usually low, and the negative electrode film is prone to falling off and dusting.

In an embodiment of the battery according to the first aspect of the present disclosure, the protrusions T on the surfaces of the positive electrode film 12 may have the same composition as that of the positive electrode film 12, and the protrusions T on the surfaces of the negative electrode film 22 may have the same composition as that of the negative electrode film 22. In an example, the protrusions T may be formed on the surfaces of the positive electrode film 12 and/or the negative electrode film 22 by roll compacting the positive electrode plate and/or the negative electrode plate using a counter roller having a protrusion structure after the electrode plates are cold pressed and before the procedure of winding (or laminating) to form the cell. In this way, not only the production costs can be reduced, but also the production efficiency is high.

In the battery according to the first aspect of the present disclosure, in an example, the protrusions T may be distributed, in the form of an array, on the surfaces of the positive electrode film 12 and/or the negative electrode film 22.

In an embodiment of the battery according to the first aspect of the present disclosure, the protrusions T are in a form of various regular or irregular shapes, and in an example, the protrusions are of a round, a semi-circular, a square, a rectangular or a trapezoidal.

In the battery according to the first aspect of the present disclosure, in an example, when the protrusions T are provided on the surface of the positive electrode film 12, the projected area of the protrusions T on the surface of the positive electrode film 12 is 10%-60% of the total area of the positive electrode film 12. In other words, the bottom surface area of the protrusions overlaps with 10%-60% of the total area of the positive electrode film 12.

In the battery according to the first aspect of the present disclosure, in an example, when the protrusions T are provided on the surfaces of the negative electrode film 22, the projected area of the protrusions T on the surfaces of the negative electrode film 22 is 10%-60% of the total area of the negative electrode film 22. In other words, the bottom surface area of the protrusions overlaps with 10%-60% of the total area of the negative electrode film 22.

In an embodiment of the battery according to the first aspect of the present disclosure, the positive electrode film 12 may be disposed on any one surface of the positive electrode current collector 11, or on both the upper and lower surfaces of the positive electrode current collector 11. That is, the positive electrode film 12 may be disposed on at least one surface of the positive electrode current collector 11 (similarly, at least one surface of the positive electrode film 12 is provided with protrusions. The types of the positive electrode active material are not particularly limited, and may be selected according to actual needs. Taking a lithium ion battery as an example, the positive electrode active material may be selected from one or more of the group consisting of a lithium transition metal oxide, and a compound obtained by adding an additional transition metal, non-transition metal or non-metal to a lithium transition metal oxide. In an example, the positive electrode active material may be selected from one or more of the group consisting of lithium cobalt oxide ($LiCoO_2$), lithium nickel oxide ($LiNiO_2$), lithium manganese oxide ($LiMnO_2$), lithium nickel manganese oxide ($LiNi_xMn_{2-x}O_4$, $0 \leq x \leq 2$), lithium ternary complex such as lithium nickel cobalt manganese oxide (i.e., NCM series, for example NCM 111, NCM 442, NCM 523, NCM 622 and NCM 811) and lithium nickel cobalt aluminum oxide (i.e., NCA series), and a lithium-containing phosphate having an olivine structure, in which the lithium-containing phosphate having an olivine structure may be further coated with a carbon coating layer. The crystal volume of the lithium-containing phosphate material having an olivine structure is almost constant during the charge and discharge process, so that the volume expansion of the positive electrode plate due to charge and discharge can be reduced to the greatest extent. In an example, the primary particle size of the lithium-containing phosphate having an olivine structure is from 100 nm to 1 μm. The carbon-coated lithium-containing phosphate having an olivine structure can not only effectively ensure the electrical conductivity between the positive electrode active material particles, but also ensure the electrical conductivity between the positive electrode film and the positive electrode current collector. Meanwhile, the existence of the carbon coating layer can also reduce the probability of dissolution of the transition metal (such as Fe element) from the positive electrode active material under the action of the electrolyte, thus preventing the increase of the expansive force of the battery caused by the deposition of the side reaction product. The thickness of the carbon coating layer may be, for example, 5 nm to 13 nm.

The lithium-containing phosphate having an olivine structure may have a general formula of $LiFe_{1-x-y}Mn_xM'_yPO_4$, in which $0 \leq x \leq 1$, $0 \leq y \leq 0.1$, $0 \leq x+y \leq 1$, M' is selected from one or more of the group consisting of the transition metal elements other than Fe and Mn or non-transition metal elements, in an example M' is selected from one or more of the group consisting of Cr, Mg, Ti, Al, Zn, W, Nb, and Zr. In another example, the lithium-containing phosphate having an olivine structure is selected from one or more of the group consisting of lithium iron phosphate ($LiFePO_4$), lithium manganese phosphate ($LiMnPO_4$), and lithium manganese iron phosphate ($LiFe_{1-a}Mn_aPO_4$, $0 < a < 1$).

In an embodiment of the battery according to the first aspect of the present disclosure, the positive electrode film 12 may further include a conductive agent and a binder. The types of the binder and the conductive agent are not particularly limited, and may be selected according to actual needs. In an example, the binder may be selected from one or more of the group consisting of polyvinylidene fluoride, polytetrafluoroethylene, polyvinylidene fluoride-tetrafluoroethylene-propylene terpolymer, polyvinylidene fluoride-hexafluoropropylene-tetrafluoroethylene terpolymer, tetrafluoroethylene-hexafluoropropylene copolymer, and a fluorine-containing acrylate resin. In an example, the conductive agent may be selected from one or more of the group consisting of conductive carbon black, superconducting carbon black, conductive graphite, acetylene black, ketjen black, graphene, and carbon nanotubes.

In the battery according to the first aspect of the present disclosure, the negative electrode film 22 may be disposed on any one of surfaces of the negative electrode current collector 21, or on both the upper and lower surfaces of the negative electrode current collector 21. That is, the negative electrode film 22 may be disposed on at least one surface of the negative electrode current collector 21 (similarly, at least one surface of the negative electrode film 22 is provided with protrusions. The types of the negative electrode active material are not particularly limited, and may be selected according to actual needs. Taking a lithium ion battery as an example, the negative electrode active material may be selected from one or more of the group consisting of graphite, soft carbon, hard carbon, carbon fibers, mesocarbon microbeads, silicon-based materials, tin-based materials, and lithium titanate. Where the graphite may be selected from one or more of artificial graphite and natural graphite; the silicon-based material may be selected from one or more of the group consisting of silicon, silicon oxide, silicon-carbon composites, and silicon alloys; and the tin-based material may be selected from one or more of tin, tin oxide and tin alloys. The negative electrode active material may be, for example, artificial graphite, and the artificial graphite may be, for example, non-needle coke secondary particles. The particle expansion of such artificial graphite tends to be isotropic, which can effectively reduce the expansion of the negative electrode plate in the thickness direction, thereby effectively reducing the expansive force of the battery. In an example, the artificial graphite has a degree of graphitization from 91% to 95%.

In the battery according to the first aspect of the present disclosure, the negative electrode film 22 may further include a binder and a conductive agent. The types of the binder and the conductive agent are not particularly limited, and may be selected according to actual needs. In an example, the binder may be selected from one or more of styrene-butadiene rubber emulsion (SBR) and sodium carboxymethyl cellulose (CMC). In an example, the conductive agent may be selected from one or more of conductive carbon black, superconducting carbon black, conductive graphite, acetylene black, ketjen black, graphene and carbon nanotubes.

In the battery according to the first aspect of the present disclosure, the type of the positive electrode current collector is not particularly limited, and may be selected according to actual needs. In an example, the positive electrode current collector may be an aluminum foil, a composite substrate having an aluminum layer on its surface, or an aluminum foil provided with a carbon layer on its surface.

In the battery according to the first aspect of the present disclosure, the type of the negative electrode current collector is not particularly limited, and may be selected according to actual needs. In an example, the negative electrode current collector may be a copper foil, a composite substrate having an copper layer on its surface, or a copper foil provided with a carbon layer on its surface.

In the battery according to the first aspect of the present disclosure, the separator 3 is made of polyethelene (PE) or polypropylene (PP), and the separator 3 has a thickness of 7 μm-20 μm and a porosity of 35%-45%. This not only ensures the mechanical manufacturability of the separator, but also ensures the good liquid absorption capacity and good electrochemical performance of the battery, thereby reducing the increase of the expansive force in the battery due to the accumulation of side reaction products.

In the battery according to the first aspect of the present disclosure, the electrolyte may include a lithium salt, an organic solvent, and an additive which is optionally added.

The lithium salt may be an organic lithium salt or an inorganic lithium salt. In an example, the lithium salt may be selected from one or more of lithium hexafluorophosphate, lithium tetrafluoroborate, lithium perchlorate, lithium hexafluoroarsenate, lithium tetrafluorooxalato phosphate, $LiN(SO_2RF)_2$, $LiN(SO_2F)(SO_2RF)$, bis(trifluoromethylsulfonyl)imide, lithium bis(fluorosulfonyl)imide, lithium bis (oxalato)borate, and lithium difluoro(oxalato)borate, in which the substituent RF is $C_nF_{2n+1}$, where n is an integer from 1 to 10. In another example, the lithium salt is lithium hexafluorophosphate. The lithium salt may have a concentration of 0.6 mol/L to 1.2 mol/L.

The organic solvent may include a chain ester and a cyclic ester. The chain ester may be selected from one or more of the group consisting of dimethyl carbonate, diethyl carbonate, methyl ethyl carbonate, methyl propyl carbonate, methyl formate, ethyl formate, methyl acetate, ethyl acetate, propyl propionate, ethyl butyrate, ethyl propionate and propyl butyrate. The cyclic ester may be selected from one or more of the group consisting of ethylene carbonate, propylene carbonate, butylene carbonate, ethylene sulfite, propylene sulfite, γ-butyrolactone and tetrahydrofuran. In addition, the organic solvent may further include different types of ionic liquids and the like.

The additive may be vinylene carbonate, to ensure the stability of the solid electrolyte interphase film (i.e., SEI film) and reduce the increase of the expansive force of the battery due to the accumulation of side reaction products, and the content of the additive may be 1.5% to 2.5% of the total weight of the electrolyte.

In the battery according to the first aspect of the present disclosure, the battery further includes a case, and the case may be made of aluminum, steel or plastic, and have a thickness of 0.4 μm to 1.0 μm. The case mainly functions to ensure a certain rigidity, so as to exert a certain restrictive force on the expansion of the internal cell when the battery expands, and reduce the external force of the battery expansion. After the cell enters the case, a certain amount of remain space can be reserved, which can provide a space for the expansion of the cell during the charge and discharge process, and reduces the overall expansive force of the battery. Where the amount of remain space can be set to 9%-11% of case volume.

Next, the method for preparing a battery according to the second aspect of the present invention is described, which is used to prepare the battery according to the first aspect of the present disclosure, and the method includes the following steps:

step 1: coating a positive electrode slurry including a positive electrode active material onto a positive electrode current collector, drying and cold pressing, to obtain a positive electrode plate; coating a negative electrode slurry including a negative electrode active material onto a negative electrode current collector, drying and cold pressing, to obtain a negative electrode plate; and measuring an initial thickness of a positive electrode film in the positive electrode plate as $H_1$ and as initial thickness of a negative electrode film in the negative electrode plate as $H_2$;

step 2: assembling the positive electrode plate and the negative electrode plate prepared in step 1, a separator, and an electrolyte into a case to obtain a battery to be tested, charging the battery to be tested to 100% SOC, and disassembling the battery to be tested after being disconnected from a power supply; measuring a thickness of the positive electrode film as $H_1'$ and a thickness of the negative electrode film as $H_2'$, and calculating a thickness increase of the positive electrode film as $H_c=H_1'-H_1$, and a thickness increase of the negative electrode film as $H_a=H_2'-H_2$; and step 3: roll compacting the positive electrode plate and/or the negative electrode plate prepared in step 1 using a counter roller having a protrusion structure to form protrusions on at least one surface of the positive electrode film and/or the negative electrode film, and with a proviso that $0.3 \leq (T_c+T_a)/(H_c+H_a) \leq 1$, where $T_c$ is a height of the protrusions provided on the at least one surface of the positive electrode film, and $T_a$ is a height of the protrusions provided on the at least one surface of the negative electrode film; and then assembling the obtained positive electrode plate and the negative electrode plate, the separator, and the electrolyte into a case, to obtain a battery.

In an embodiment of the method for preparing the battery according to the second aspect of the present disclosure, the initial thickness $H_i$ of the positive electrode film is 0.1 mm-0.4 mm. In an embodiment of the present disclosure, the initial thickness $H_i$ of the positive electrode film is any value between 0.1 mm and 0.4 mm, for example, but not limited to, 100 μm, 120 μm, 150 μm, 180 μm, 200 μm, 300. Mm or 400 μm, including any and all values and ranges and sub-ranges (eg 100 μm~200 μm, 120 μm~180 μm, etc.).

In an embodiment of the method for preparing the battery according to the second aspect of the present disclosure, the initial thickness $H_2$ of the negative electrode film is 0.07 mm-0.3 mm. In an embodiment of the present disclosure, the initial thickness $H_2$ of the negative electrode film is any value between 0.07 mm and 0.3 mm, for example, but not limited to, 70 μm, 80 μm, 100 μm, 115 μm, 130 μm, 150 μm, 200 μm, 300 μm, including any and all values and ranges and sub-ranges (eg 100 μm~200 μm, 120 μm~180 μm, etc.)

In an embodiment of the method for preparing the battery according to the second aspect of the present disclosure, the positive electrode slurry and/or negative electrode slurry may further include one or more of the group consisting of a conductive agent, a binder, a thickener, a solvent (especially an organic solvent) and the like. And the conductive agent, the binder and the solvent are as described above and will not be described herein. The thickener may be selected from one or more of the group consisting of methylcellulose, hydroxypropylmehycellulose, sodium carboxymethyl cellulose, silicone gel, polyacrylamide, N-methylpyrrolidone, polyvinylpyrrolidone. In an example, the thickener is sodium carboxymethyl cellulose. The conductive agent, the binder, the thickener and the solvent will be selected according to actual needs, and the amounts of them are not particularly limited as long as the technical solution of the present disclosure can be achieved.

The present disclosure is further described below in conjunction with examples. It is to be understood that these examples are merely illustrative of the present disclosure and are not intended to limit the scope of the present disclosure. The battery is only exemplified as a lithium ion battery in the examples, but the present disclosure is not limited thereto.

Example 1

Step 1: Preparation of Electrode Plates

The carbon-coated $LiFePO_4$ (where the thickness of the carbon coating is 6 nm, and $LiFePO_4$ is of a primary particle structure and has an average particle size of 120 nm) is used as a positive electrode active material, acetylene black is used as conductive agent, polyvinylidene fluoride is used as a binder, and N-methylpyrrolidone is used as a solvent. The above raw materials are mixed uniformly by stirring to form a positive electrode slurry, in which the weight ratio of the positive electrode active material, the conductive agent, and the binder is 94:4:2. Then the positive electrode slurry is uniformly coated onto both the upper and lower surfaces of a positive electrode current collector that is an aluminum foil, after drying at 85° C., cold pressing is performed, followed by cutting to form a positive electrode plate having a predetermined size.

Artificial graphite (in the form of non-needle coke secondary particles, and has a degree of graphitization of 94%) is used as a negative electrode active material, acetylene black is used as a conductive agent, sodium carboxymethyl cellulose is used as a thickener, styrene-butadiene rubber is used as a binder, and deionized water is used as a solvent. The above raw materials are mixed uniformly by stirring to form a negative electrode slurry, in which the weight ratio of the negative electrode active material, the conductive agent, the thickener, and the binder is 95:1.5:0.4:3.1. Then, the negative electrode slurry is uniformly coated onto both the upper and lower surfaces of a negative electrode current collector that is a copper foil, after drying at 85° C., cold pressing is performed, followed by cutting to form a negative electrode plate having a predetermined size.

Where in the obtained positive electrode plate and negative electrode plate, a thickness of a positive electrode film is 180 μm, and a thickness of a negative electrode film is 115 μm.

Step 2: Test for Thickness Increase of Positive Electrode Film and Thickness Increase of Negative Electrode Film The positive electrode plate, the negative electrode plate prepared in step 1 and a separator are wound to obtain a cell, then the cell is placed in a case (which is a 0.8 μm-thick aluminum case, with a remain space being 10%), followed by assembling, injecting an electrolyte, formation, venting and other procedures, to obtain a battery to be tested. The battery to be tested is charged to 100% SOC, and disassembled after being disconnected from the power supply. At this time, a thickness increase of the positive electrode film is determined to be 3.6 μm, and a thickness increase of the negative electrode film is determined to be 23 μm.

The separator is a polyethene (PE) film having a thickness of 12 μm and a porosity of 38%. The electrolyte is a solution in which a mixed organic solvents of ethylene carbonate (EC), dimethyl carbonate (DMC), diethyl carbonate (DEC), and methyl ethyl carbonate (EMC) at a weight ratio of 30:20:20:30, the lithium salt is $LiPF_6$, having a concentration of 1.0 mol/L, and the additive in the electrolyte is vinylene carbonate with an addition amount of 2%.

Step 3: Preparation of Battery

The positive electrode plate prepared in step 1 is roll compacted using a counter roller having a protrusion structure, to form protrusions that are 10 μm high on the surfaces of the positive electrode film. Then, as shown in FIG. 5, the positive electrode plate having a protrusion structure is wound with the negative electrode plate prepared in step 1 and the separator to obtain a cell Then, the cell is placed in a case (which is a 0.8 μm thick aluminum case, with a remain space being 10%), and a battery is finally obtained by assembling, injecting an electrolyte, formation, venting, and other procedures.

Example 2

The preparation process of the battery is the same as that of Example 1, except that the height of the protrusions on the surface of the positive electrode film is 15 μm.

Example 3

The preparation process of the battery is the same as that of Example 1, except that the height of the protrusions on the surface of the positive electrode film is 19 μm.

Example 4

The preparation process of the battery is the same as that of Example 1, except that the height of the protrusions on the surface of the positive electrode film is 22 μm.

Example 5

The preparation process of the battery is the same as that of Example 1, except that the height of the protrusions on the surface of the positive electrode film is 26 μm.

Example 6

Step 1: Preparation of Electrode Plates

The carbon-coated $LiFePO_4$ (where the thickness of the carbon coating is 6 nm, and $LiFePO_4$ is of a primary particle structure and has an average particle size of 120 nm) is used as a positive electrode active material, acetylene black is used as conductive agent, polyvinylidene fluoride is used as a binder, and N-methylpyrrolidone is used as a solvent. The above raw materials are mixed uniformly by stirring to form a positive electrode slurry, in which the weight ratio of the positive electrode active material, the conductive agent, and the binder is 94:4:2. Then the positive electrode slurry is uniformly coated onto both the upper and lower surfaces of a positive electrode current collector that is an aluminum foil, after drying at 85° C., cold pressing is performed, followed by cutting to form a positive electrode plate having a predetermined size.

Artificial graphite (in the form of non-needle coke secondary particles, and has a degree of graphitization of 94%) is used as a negative electrode active material, acetylene black is used as a conductive agent, sodium carboxymethyl cellulose is used as a thickener, styrene-butadiene rubber is used as a binder, and deionized water is used as a solvent. The above raw materials are mixed uniformly by stirring to form a negative electrode slurry, in which the weight ratio of the negative electrode active material, the conductive agent, the thickener, and the binder is 95:1.5:0.4:3.1. Then, the negative electrode slurry is uniformly coated onto both the upper and lower surfaces of a negative electrode current collector that is a copper foil, after drying at 85° C., cold pressing is performed, followed by cutting to form a negative electrode plate having a predetermined size.

Where in the obtained positive electrode plate and negative electrode plate, a thickness of a positive electrode film is 180 μm, and a thickness of a negative electrode film is 115 μm.

Step 2: Test for Thickness Increase of Positive Electrode Film and Thickness Increase of Negative Electrode Film The positive electrode plate, the negative electrode plate prepared in step 1 and a separator are wound to obtain a cell, then the cell is placed in a case (which is a 0.8 μm thick aluminum case, with a remain space being 10%), followed by assembling, injecting an electrolyte, formation, venting and other procedures, to obtain a battery to be tested. The battery to be tested is charged to 100% SOC, and disassembled after being disconnected from the power supply. At this time, a thickness increase of the positive electrode film is determined to be 3.6 μm, and a thickness increase of the negative electrode film is determined to be 23 μm.

The separator is a polypropylene (PP) film having a thickness of 20 μm and a porosity of 40%. The electrolyte is a solution in which a mixed organic solvents of ethylene carbonate (EC), dimethyl carbonate (DMC), diethyl carbonate (DEC), and methyl ethyl carbonate (EMC) at a weight ratio of 35:25:20:20, the lithium salt is $LiPF_6$, having a concentration of 1.2 mol/L, and the additive in the electrolyte is vinylene carbonate with an addition amount of 2.5%.

Step 3: Preparation of Battery

The negative electrode plate prepared in step 1 is roll compacted using a counter roller having a protrusion structure, to form protrusions that are 16 μm high on the surfaces of the negative electrode film. Then, as shown in FIG. 6, the negative electrode plate having a protrusion structure is wound with the positive electrode plate prepared in step 1 and the separator to obtain a cell. Then, the cell is placed in a case (which is a 0.6 μm-thick aluminum case, with a remain space being 10%), and a battery is finally obtained by assembling, injecting an electrolyte, formation, venting, and other procedures.

Example 7

Step 1: Preparation of Electrode Plates

NCM523 (where NCM523 is of a secondary particle structure and has an average particle size of 10 nm) is used as a positive electrode active material, acetylene black is used as conductive agent, polyvinylidene fluoride is used as a binder, and N-methylpyrrolidone is used as a solvent. The above raw materials are mixed uniformly by stirring to form a positive electrode slurry, in which the weight ratio of the positive electrode active material, the conductive agent, and the binder is 94:4:2. Then the positive electrode slurry is uniformly coated onto both the upper and lower surfaces of a positive electrode current collector that is an aluminum foil, after drying at 85° C., cold pressing is performed, followed by cutting to form a positive electrode plate having a predetermined size.

Artificial graphite (in the form of non-needle coke secondary particles, and has a degree of graphitization of 94%) is used as a negative electrode active material, acetylene black is used as a conductive agent, sodium carboxymethyl cellulose is used as a thickener, styrene-butadiene rubber is used as a binder, and deionized water is used as a solvent. The above raw materials are mixed uniformly by stirring to form a negative electrode slurry, in which the weight ratio of the negative electrode active material, the conductive agent, the thickener, and the binder is 95:1.5:0.4:3.1. Then, the negative electrode slurry is uniformly coated onto both the upper and lower surfaces of a negative electrode current collector that is a copper foil, after drying at 85° C., cold pressing is performed, followed by cutting to form a negative electrode plate having a predetermined size.

Where in the obtained positive electrode plate and negative electrode plate, a thickness of a positive electrode film is 122 μm, and a thickness of a negative electrode film is 115 μm.

Step 2: Test for Thickness Increase of Positive Electrode Film and Thickness Increase of Negative Electrode Film The positive electrode plate, the negative electrode plate prepared in step 1 and a separator are wound to obtain a cell, then the cell is placed in a case (which is a 0.8 μm-thick aluminum case, with a remain space being 10%), followed by assembling, injecting an electrolyte, formation, venting and other procedures, to obtain a battery to be tested. The battery to be tested is charged to 100% SOC, and disassembled after being disconnected from the power supply. At this time, a thickness increase of the positive electrode film is determined to be 6.1 μm, and a thickness increase of the negative electrode film is determined to be 23 μm.

The separator is a PE film having a thickness of 12 μm and a porosity of 38%. The electrolyte is a solution in which a mixed organic solvents of ethylene carbonate (EC), dimethyl carbonate (DMC), diethyl carbonate (DEC), and methyl ethyl carbonate (EMC) at a weight ratio of 30:20:20:30, the lithium salt is $LiPF_6$, having a concentration of 1.0 mol/L, and the additive in the electrolyte is vinylene carbonate with an addition amount of 2%.

Step 3: Preparation of Battery

The positive electrode plate prepared in step 1 is roll compacted using a counter roller having a protrusion structure, to form protrusions that are 15 Lm high on the surfaces of the positive electrode film. Then as shown in FIG. 5S, the positive electrode plate having a protrusion structure is wound with the negative electrode plate prepared in step 1 and the separator to obtain a cell. Then, the cell is placed in a case (which is a 0.8 Lm thick aluminum case, with a remain space being 10%), and a battery was finally obtained by assembling, injecting an electrolyte, formation, venting, and other procedures.

Example 8

Step 1: Preparation of Electrode Plates

A mixture of NCM523 and NCM811 (where they both are of a secondary particle structure and have an average particle size of 10 µm) at a weight ratio of 1:1 is used as a positive electrode active material, acetylene black is used as conductive agent, polyvinylidene fluoride is used as a binder, and N-methylpyrrolidone is used as a solvent. The above raw materials are mixed uniformly by stirring to form a positive electrode slurry, in which the weight ratio of the positive electrode active material, the conductive agent, and the binder is 94:4:2. Then the positive electrode slurry is uniformly coated onto both the upper and lower surfaces of a positive electrode current collector that is an aluminum foil, after drying at 85° C., cold pressing is performed, followed by cutting to form a positive electrode plate having a predetermined size.

Artificial graphite (in the form of non-needle coke secondary particles, and has a degree of graphitization of 94%) is used as a negative electrode active material, acetylene black is used as a conductive agent, sodium carboxymethyl cellulose is used as a thickener, styrene-butadiene rubber is used as a binder, and deionized water is used as a solvent. The above raw materials are mixed uniformly by stirring to form a negative electrode slurry, in which the weight ratio of the negative electrode active material, the conductive agent, the thickener, and the binder are 95:1.5:0.4:3.1. Then, the negative electrode slurry is uniformly coated onto both the upper and lower surfaces of a negative electrode current collector that is a copper foil, after drying at 85° C., cold pressing is performed, followed by cutting to form a negative electrode plate having a predetermined size.

Where in the obtained positive electrode plate and negative electrode plate, the thickness of a positive electrode film is 122 µm, and the thickness of a negative electrode film is 115 µm.

Step 2; Test for Thickness Increase of Positive Electrode Film and Thickness Increase of Negative Electrode Film The positive electrode plate and the negative electrode plate prepared in step 1 and a separator are wound to obtain a cell, then the cell is placed in a case (which is a 0.8 µm thick aluminum case, with a remain space being 10%), followed by assembling, injecting an electrolyte, formation, venting and other procedures, to obtain a battery to be tested. The battery to be tested is charged to 100% SOC, and disassembled after being disconnected from the power supply. At this time, the thickness increase of the positive electrode film is determined to be 7.3 µm, and the thickness increase of the negative electrode film is determined to be 23 µm.

The separator is a PE film having a thickness of 12 µm and a porosity of 38%. The electrolyte is a solution in which an mixed organic solvents of ethylene carbonate (EC), dimethyl carbonate (DMC), diethyl carbonate (DEC), and methyl ethyl carbonate (EMC) at a weight ratio of 30:20:20:30, the lithium salt is $LiPF_6$, having a concentration of 1.0 mol/L, and the additive in the electrolyte is vinylene carbonate with an addition amount of 2%.

Step 3: Preparation of Battery

The positive electrode plate prepared in step 1 is roll compacted using a counter roller having a protrusion structure, to form protrusions that are 20 µm high on the surfaces of the positive electrode film. Then as shown in FIG. 5, the positive electrode plate having a protrusion structure is wound with the negative electrode plate prepared in step 1 and the separator to obtain a cell. Then, the cell is placed in a case (which is a 0.8 µm thick aluminum case, with a remain space being 10%), and a battery is finally obtained by assembling, injecting an electrolyte, formation, venting, and other procedures.

Example 9

Step 1: Preparation of Electrode Plates

NCM811 (where NCM811 is of a secondary particle structure, and has an average particle size of 10 µm) is used as a positive electrode active material, acetylene black is used as conductive agent, polyvinylidene fluoride is used as a binder, and N-methylpyrrolidone is used as a solvent. The above raw materials are mixed uniformly by stirring to form a positive electrode slurry, in which the weight ratio of the positive electrode active material, the conductive agent, and the binder is 94:4:2. Then the positive electrode slurry is uniformly coated onto both the upper and lower surfaces of a positive electrode current collector that is an aluminum foil, after drying at 85° C., cold pressing is performed, followed by cutting to form a positive electrode plate having a predetermined size.

Artificial graphite (in the form of non-needle coke secondary particles, and has a degree of graphitization of 94%) is used as a negative electrode active material, acetylene black is used as a conductive agent, sodium carboxymethyl cellulose is used as a thickener, styrene-butadiene rubber is used as a binder, and deionized water is used as a solvent. The above raw materials are mixed uniformly by stirring to form a negative electrode slurry, in which the weight ratio of the negative electrode active material, the conductive agent, the thickener, and the binder is 95:1.5:0.4:3.1. Then, the negative electrode slurry is uniformly coated onto both the upper and lower surfaces of a negative electrode current collector that is a copper foil, after drying at 85° C., cold pressing is performed, followed by cutting to form a negative electrode plate having a predetermined size.

Where in the obtained positive electrode plate and negative electrode plate, the thickness of a positive electrode film is 122 µm, and the thickness of a negative electrode film is 115 µm.

Step 2: Test for Thickness Increase of Positive Electrode Film and Thickness Increase of Negative Electrode Film The positive electrode plate and the negative electrode plate prepared in step 1 and a separator are wound to obtain a cell, then the cell is placed in a case (which is a 0.8 µm thick aluminum case, with a remain space being 10%), followed by assembling, injecting an electrolyte, formation, venting and other procedures, to obtain a battery to be tested. The battery to be tested is charged to 100% SOC, and disassembled after being disconnected from the power supply. At this time, the thickness increase of the positive electrode film is determined to be 9.8 μm, and the thickness increase of the negative electrode film is determined to be 23 μm.

The separator is a PE film having a thickness of 12 μm and a porosity of 38%. The electrolyte is a solution in which a mixed organic solvents of ethylene carbonate (EC), dimethyl carbonate (DMC), diethyl carbonate (DEC), and methyl ethyl carbonate (EMC) at a weight ratio of 30:20:20:30, the lithium salt is $LiPF_6$, having a concentration of 1.0 mol/L, and the additive in the electrolyte is vinylene carbonate with an addition amount of 2%.

Step 3: Preparation of Battery

The positive electrode plate prepared in step 1 is roll compacted using a counter roller having a protrusion structure, to form protrusions that are 22 μm high on the surfaces of the positive electrode film. Then as shown in FIG. 5, the positive electrode plate having a protrusion structure is wound with the negative electrode plate prepared in step 1 and the separator to obtain a cell. Then, the cell is placed in a case (which is a 0.8 μm-thick aluminum case, with a remain space being 10%), and a battery is finally obtained by assembling, injecting an electrolyte, formation, venting, and other procedures.

Example 10

Step 1: Preparation of Electrode Plates

NCM811 (where NCM811 is of a secondary particle structure, and has an average particle size of 10 μm) is used as a positive electrode active material, acetylene black is used as conductive agent, polyvinylidene fluoride is used as a binder, and N-methylpyrrolidone is used as a solvent. The above raw materials are mixed uniformly by stirring to form a positive electrode slurry, in which the weight ratio of the positive electrode active material, the conductive agent, and the binder is 94:4:2. Then the positive electrode slurry is uniformly coated onto both the upper and lower surfaces of a positive electrode current collector that is an aluminum foil, after drying at 85° C., cold pressing is performed, followed by cutting to form a positive electrode plate having a predetermined size.

Silicon dioxide is used as a negative electrode active material, acetylene black is used as a conductive agent, sodium carboxymethyl cellulose is used as a thickener, styrene-butadiene rubber is used as a binder, and deionized water is used as a solvent. The above raw materials are mixed uniformly by stirring to form a negative electrode slurry, in which the weight ratio of the negative electrode active material, the conductive agent, the thickener, and the binder is 95:1.5:0.4:3.1. Then, the negative electrode slurry is uniformly coated onto both the upper and lower surfaces of a negative electrode current collector that is a copper foil, after drying at 85° C., cold pressing is performed, followed by cutting to form a negative electrode plate having a predetermined size.

Where in the obtained positive electrode plate and negative electrode plate, the thickness of a positive electrode film is 122 μm, and the thickness of a negative electrode film is 115 μm.

Step 2: Test for Thickness Increase of Positive Electrode Film and Thickness Increase of Negative Electrode Film The positive electrode plate and the negative electrode plate prepared in step 1 and a separator are wound to obtain a cell, then the cell is placed in a case (which is a 0.8 μm thick aluminum case, with a remain space being 10%), followed by assembling, injecting an electrolyte, formation, venting and other procedures, to obtain a battery to be tested. The battery to be tested is charged to 100% SOC, and disassembled after being disconnected from the power supply. At this time, the thickness increase of the positive electrode film is determined to be 9.8 μm, and the thickness increase of the negative electrode film is determined to be 57.5 μm.

The separator is a PE film having a thickness of 12 μm and a porosity of 38%. The electrolyte is a solution of a mixed organic solvent in which ethylene carbonate (EC), dimethyl carbonate (DMC), diethyl carbonate (DEC), and methyl ethyl carbonate (EMC) at a weight ratio of 30:20:20:30, the lithium salt is $LiPF_6$, having a concentration of 1.0 mol/L, and the additive in the electrolyte is vinylene carbonate with an addition amount of 2%.

Step 3: Preparation of Battery

The positive electrode plate and the negative electrode plate prepared in step 1 are respectively roll compacted using a counter roller having a protrusion structure, where the height of the protrusions on the surfaces of the positive electrode film is 10 μm and the height of the protrusions on the surface of the negative electrode film is 15 μm. Then as shown in FIG. 7, the positive electrode plate having a protrusion structure, the negative electrode plate having a protrusion structure and the separator are wound to obtain a cell. Then, the cell is placed in a case (which is a 0.8 μm-thick aluminum case, with a remain space being 10%), and a battery is finally obtained by assembling, injecting an electrolyte, formation, venting, and other procedures.

Example 11

Step 1: Preparation of Electrode Plates

NCM811 (where NCM811 is of a secondary particle structure, and has an average particle size of 10 μm) is used as a positive electrode active material, acetylene black is used as conductive agent, polyvinylidene fluoride is used as a binder, and N-methylpyrrolidone is used as a solvent. The above raw materials are mixed uniformly by stirring to form a positive electrode slurry, in which the weight ratio of the positive electrode active material, the conductive agent, and the binder is 94:4:2. Then the positive electrode slurry is uniformly coated onto both the upper and lower surfaces of a positive electrode current collector that is an aluminum foil, after drying at 85° C., cold pressing is performed, followed by cutting to form a positive electrode plate having a predetermined size.

Silicon dioxide is used as a negative electrode active material, acetylene black is used as a conductive agent, sodium carboxymethyl cellulose is used as a thickener, styrene-butadiene rubber is used as a binder, and deionized water is used as a solvent. The above materials are mixed uniformly by stirring to form a negative electrode slurry, in which the weight ratio of the negative electrode active material, the conductive agent, the thickener and the binder is 95:1.5:0.4:3.1. Then, the negative electrode slurry is uniformly coated onto both the upper and lower surfaces of a negative electrode current collector that is a copper foil, after drying at 85° C., cold pressing is performed, followed by cutting to form a negative electrode plate having a predetermined size.

Where in the obtained positive electrode plate and negative electrode plate, a thickness of a positive electrode film is 122 μm, and a thickness of a negative electrode film is 115 μm.

Step 2: Test for Thickness Increase of Positive Electrode Film and Thickness Increase of Negative Electrode Film The positive electrode plate and the negative electrode plate prepared in step 1 and a separator are wound to obtain a cell, then the cell is placed in a case (which is a 0.8 μm thick aluminum case, with a remain space being 10%), followed by assembling, injecting an electrolyte, formation, venting and other procedures, to obtain a battery to be tested. The battery to be tested is charged to 100% SOC, and disassembled after being disconnected from the power supply. At this time, a thickness increase of the positive electrode film is determined to be 9.8 μm, and a thickness increase of the negative electrode film is determined to be 57.5 μm.

The separator is a PE film having a thickness of 12 μm and a porosity of 38%. The electrolyte is a solution of a mixed organic solvent in which ethylene carbonate (EC), dimethyl carbonate (DMC), diethyl carbonate (DEC), and methyl ethyl carbonate (EMC) at a weight ratio of 30:20:20:30, the lithium salt is $LiPF_6$, having a concentration of 1.0 mol/L, and the additive in the electrolyte is vinylene carbonate with an addition amount of 2%.

Step 3: Preparation of Battery

The negative electrode plate prepared in step 1 is roll compacted using a counter roller having a protrusion structure, to form protrusions that are 21 μm high on the surface of the negative electrode film. Then as shown in FIG. 6, the negative electrode plate having a protrusion structure is wound with the positive electrode plate prepared in step 1 and the separator to obtain a cell. Then, the cell is placed in a case (which is a 0.8 μm thick aluminum case, with a remain space being 10%), and a battery is finally obtained by assembling, injecting an electrolyte, formation, venting, and other procedures.

Comparative Example 1

The preparation process of the battery is the same as that of Example 1, except that no protrusions are provided on the surface of the positive electrode film.

Comparative Example 2

The preparation process of the battery is the same as that of Example 7, except that no protrusions are provided on the surface of the positive electrode film.

Comparative Example 3

The preparation process of the battery is the same as that of Example 11, except that no protrusions are provided on the surface of the negative electrode film.

Comparative Example 4

The preparation process of the battery is the same as that of Example 1, except that the height of the protrusions on the surface of the positive electrode film is 40 μm.

Comparative Example 5

The preparation process of the battery is the same as that of Example 1, except that the height of the protrusions on the surface of the positive electrode film is 5 μm.

Next, the batteries prepared by Examples 1-11 and Comparative Examples 1-5 are subjected to a full-charging and full-discharging cycle test at 60° C. with a charge and discharge rate of 1 C. A steel clamp is connected to a pressure sensor to monitor the expansive force data in real time, and the number of cycles when the battery capacity is attenuated to 80% and the expansive force of the battery are recorded.

It can be seen from the test results in Table 1 that when the height of the protrusions on the surface of the positive electrode film and negative electrode film are rationally controlled to meet the condition that $0.3 \le (T_c + T_a)/(H_c + H_a) \le 1$, the expansive force of the battery can be effectively reduced and the cycle life of the battery can be prolonged. In an example, $0.4 \le (T_c + T_a)/(H_c + H_a) \le 0.8$; and in an example $0.6 \le (T_c + T_a)/(H_c + H_a) \le 0.8$.

In Comparative Examples 1, 2 and 3, because no protrusions are provided on the surface of the positive electrode film or the negative electrode film, so that during the charge and discharge process, there is no enough space inside the battery to accommodate the volume expansion of the positive and negative electrode plates, thereby resulting in a very large expansive force, poor cycle performance and safety performance of the battery.

In Comparative Example 4, too high protrusions are provided on the surface of the positive electrode film. Although sufficient space is provided to accommodate the volume expansion of the positive and negative electrode plates during the charge and discharge process of the battery, a too large volume expansion space causes the electrolyte to be relatively insufficient, the infiltration of the electrolyte into the positive and negative electrode plates becomes poor. The polarization of the battery is increased, and the transport path of the lithium ions is also increased during the charge and discharge process, which seriously affect the cycle life of the battery.

In Comparative Example 5, too low protrusions are provided on the surface of the positive electrode film. During the charge and discharge process, there is no enough space inside the battery to accommodate the volume expansion of the positive and negative electrode plates, resulting in a very large expansive force, and poor cycle performance and safety performance of the battery.

TABLE 1

Parameters and test results in Examples 1-11 and Comparative Examples 1-5

| | Positive electrode active material | | | Negative electrode active material | | Positive electrode film | | | Negative electrode film | | | | | Battery |
|---|---|---|---|---|---|---|---|---|---|---|---|---|---|---|
| | Type | Primary particle size | Thickness of carbon coating/nm | Type | Degree of graphitization | $H_1$/μm | $H_c$/μm | $T_c$/μm | $H_2$/μm | $H_a$/μm | $T_a$/μm | $(T_c + T_a)/(H_c + H_a)$ | Cycles | expansive force |
| Example 1 | LFP | 120 nm | 6 | Artificial graphite | 94% | 180 | 3.6 | 10 | 115 | 23 | 0 | 0.38 | 760 | 1600 Kgf |

TABLE 1-continued

Parameters and test results in Examples 1-11 and Comparative Examples 1-5

| | Positive electrode active material | | Thickness of carbon coating/ nm | Negative electrode active material | | Positive electrode film | | | Negative electrode film | | | | | Battery |
|---|---|---|---|---|---|---|---|---|---|---|---|---|---|---|
| | Type | Primary particle size | | Type | Degree of graphitization | $H_1$/ μm | $H_c$/ μm | $T_c$/ μm | $H_2$/ μm | $H_a$/ μm | $T_a$/ μm | $(T_c + T_a)/(H_c + H_a)$ | Cycles | expansive force |
| Example 2 | LFP | 120 nm | 6 | Artificial graphite | 94% | 180 | 3.6 | 15 | 115 | 23 | 0 | 0.56 | 840 | 1261 Kgf |
| Example 3 | LFP | 120 nm | 6 | Artificial graphite | 94% | 180 | 3.6 | 19 | 115 | 23 | 0 | 0.71 | 950 | 1280 Kgf |
| Example 4 | LFP | 120 nm | 6 | Artificial graphite | 94% | 180 | 3.6 | 22 | 115 | 23 | 0 | 0.83 | 1068 | 1239 Kgf |
| Example 5 | LFP | 120 nm | 6 | Artificial graphite | 94% | 180 | 3.6 | 26 | 115 | 23 | 0 | 0.98 | 970 | 1250 Kgf |
| Example 6 | LFP | 120 nm | 6 | Artificial graphite | 94% | 180 | 3.6 | 0 | 115 | 23 | 16 | 0.6 | 900 | 1270 Kgf |
| Example 7 | NCM523 | 10 μm | / | Artificial graphite | 94% | 122 | 6.1 | 15 | 115 | 23 | 0 | 0.52 | 1200 | 2050 Kgf |
| Example 8 | NCM523 + NCM811 | 10 μm | / | Artificial graphite | 94% | 122 | 7.3 | 20 | 115 | 23 | 0 | 0.66 | 1180 | 2215 Kgf |
| Example 9 | NCM811 | 10 μm | / | Artificial graphite | 94% | 122 | 9.8 | 22 | 115 | 23 | 0 | 0.67 | 1100 | 2280 Kgf |
| Example 10 | NCM811 | 10 μm | / | Silicon dioxide | / | 122 | 9.8 | 10 | 115 | 57.5 | 15 | 0.37 | 390 | 2305 Kgf |
| Example 11 | NCM811 | 10 μm | / | Silicon dioxide | / | 122 | 9.8 | 0 | 115 | 57.5 | 21 | 0.31 | 350 | 2380 Kgf |
| Comparative Example 1 | LFP | 120 nm | 6 | Artificial graphite | 94% | 180 | 3.6 | 0 | 115 | 23 | 0 | 0 | 800 | 2090 Kgf |
| Comparative Example 2 | NCM523 | 10 μm | / | Artificial graphite | 94% | 122 | 6.1 | 0 | 115 | 23 | 0 | 0 | 630 | 2400 Kgf |
| Comparative Example 3 | NCM811 | 10 μm | / | Silicon dioxide | / | 122 | 9.8 | 0 | 115 | 57.5 | 0 | 0 | 300 | 3530 Kgf |
| Comparative Example 4 | LFP | 120 nm | 6 | Artificial graphite | 94% | 180 | 3.6 | 40 | 115 | 23 | 0 | 1.5 | 400 | 800 Kgf |
| Comparative Example 5 | LFP | 120 nm | 6 | Artificial graphite | 94% | 180 | 3.6 | 5 | 115 | 23 | 0 | 0.19 | 800 | 1985 Kgf |

What is claimed is:

1. A battery, comprising a cell and an electrolyte, the cell comprising
a positive electrode plate, comprising
a positive electrode current collector and
a positive electrode film disposed on at least one surface of the positive electrode current collector and comprising a positive electrode active material;
a negative electrode plate, comprising
a negative electrode current collector and
a negative electrode film disposed on at least one surface of the negative electrode current collector and comprising a negative electrode active material; and
a separator, disposed between the positive electrode plate and the negative electrode plate;
wherein in the battery, at least one surface of the positive electrode film and/or the negative electrode film is provided with protrusions, and the battery satisfies following condition:

$$0.4(T_c+T_a)/(H_c+H_a) \leq 0.8$$

where
$T_c$ is a height of the protrusions provided on the at least one surface of the positive electrode film;
$T_a$ is a height of protrusions provided on the at least one surface of the negative electrode film;
$H_c$ is a thickness increase of the positive electrode film when the battery has a 100% SOC for a first time;
$H_a$ is a thickness increase of the negative electrode film when the battery has a 100% SOC for a first time.

2. The battery according to claim 1, wherein $$0.6(T_c+T_a)/(H_c+H_a)0.8$$

.

3. The battery according to claim 1, wherein the protrusions are distributed in a form of an array on at least one surface of the positive electrode film and/or the negative electrode film.

4. The battery according to claim 1, wherein the protrusions are in a form of various regular or irregular shapes.

5. The battery according to claim 1, wherein the protrusions are in a form of a round, a semi-circular, a square, a rectangular or a trapezoidal shape.

6. The battery according to claim 1, wherein when the protrusions are disposed on the at least one surface of the positive electrode film, the projected area of the protrusions onto at least one surface of the positive electrode film is 10%-60% of total area of the positive electrode film.

7. The battery according to claim 1, wherein when the protrusions are disposed on at least one surface of the negative electrode film, the projected area of the protrusions onto at least one surface of the negative electrode film is 10%-60% of total area of the negative electrode film.

8. The battery according to claim 1, wherein the protrusions are only disposed on at least one surface of the positive electrode film.

9. A method for preparing a battery, for preparing the battery according to claim 1, comprising steps of:

step 1: coating a positive electrode slurry comprising a positive electrode active material onto a positive electrode current collector, drying and cold pressing, to obtain a positive electrode plate;

coating a negative electrode slurry comprising a negative electrode active material onto a negative electrode current collector, drying and cold pressing, to obtain a negative electrode plat; and measuring an initial thickness of a positive electrode film of the positive electrode plate as $H_1$, and measuring an initial thickness of a negative electrode film of the negative electrode plate as $H_2$;

step 2: assembling the positive electrode plate and the negative electrode plate prepared in step 1, a separator and an electrolyte into a case to obtain a battery to be tested, charging the battery to be tested to 100% SOC, and disassembling the battery to be tested after being disconnected from a power supply; measuring a thickness of the positive electrode film as $H_1'$, the thickness of the negative electrode film as $H_2'$, and calculating a thickness increase of the positive electrode film as $H_c=H_1'-H_1$, and a thickness increase of the negative electrode film as $H_a=H_2'-H_2$; and step 3: roll compacting the positive electrode plate and/or the negative electrode plate prepared in step 1 using a counter roller having a protrusion structure to form protrusions on at least one surface of the positive electrode film and/or the negative electrode film with a proviso that $$0.4 \le (T_c+T_a)/(H_c+H_a) 0.8,$$

wherein $T_c$ is a height of the protrusions on at least one surface of the positive electrode film, and $T_a$ is a height of the protrusions on at least one surface of the negative electrode film; and reassembling the obtained positive electrode plate and the negative electrode plate, the separator, and the electrolyte into a case, to obtain a battery.

10. The method for preparing a battery according to claim 9, wherein in step 1, the initial thickness $H_1$ of the positive electrode film is 0.1 mm-0.4 mm.

11. The method for preparing a battery according to claim 9, wherein in step 1, the initial thickness $H_2$ of the negative electrode film is 0.07 mm-0.3 mm.

* * * * *